United States Patent [19]

Erdman

[11] Patent Number: 4,677,303
[45] Date of Patent: Jun. 30, 1987

[54] AUTOMATIC PRINTED CIRCUIT BOARD IMAGING SYSTEM

[75] Inventor: Rodney V. Erdman, Princeton, Minn.

[73] Assignee: Colight, a division of Canrad-Hanovia, Inc., Minneapolis, Minn.

[21] Appl. No.: 825,072

[22] Filed: Jan. 31, 1986

[51] Int. Cl.⁴ .................. G01N 21/86; B65G 47/24; B65H 9/14; B65H 9/20
[52] U.S. Cl. ............................. 250/561; 250/548; 198/345; 198/394; 271/227; 271/236; 414/225
[58] Field of Search .......... 250/548, 561, 557, 223 R; 356/375, 400; 901/7; 198/345, 339.1, 376, 394; 271/227, 228, 236; 414/225

[56] References Cited

U.S. PATENT DOCUMENTS 3,543,679 12/1970 Wahl .............................. 214/225 X
4,147,930 3/1979 Browne et al. ................. 198/394 X
4,539,479 9/1985 Sheets et al. .................... 198/345 X Primary Examiner—Eugene R. LaRoche
Assistant Examiner—David Mis
Attorney, Agent, or Firm—Faegre & Benson

[57] ABSTRACT

A printed circuit board imaging system automatically aligns apertures on a board with reference points established by light beams located outside an exposure unit. The reference points have a known spatial relation to alignment pins in the enclosure. A movable arm engages an aligned board, moves it into the exposure unit and deposits it on the pins.

19 Claims, 11 Drawing Figures

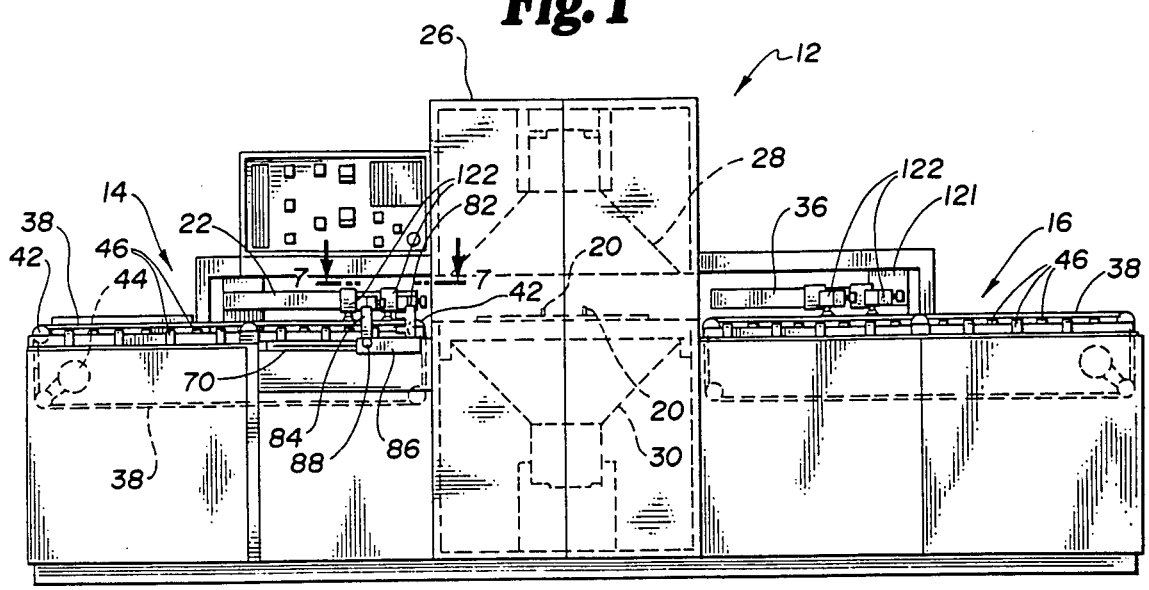
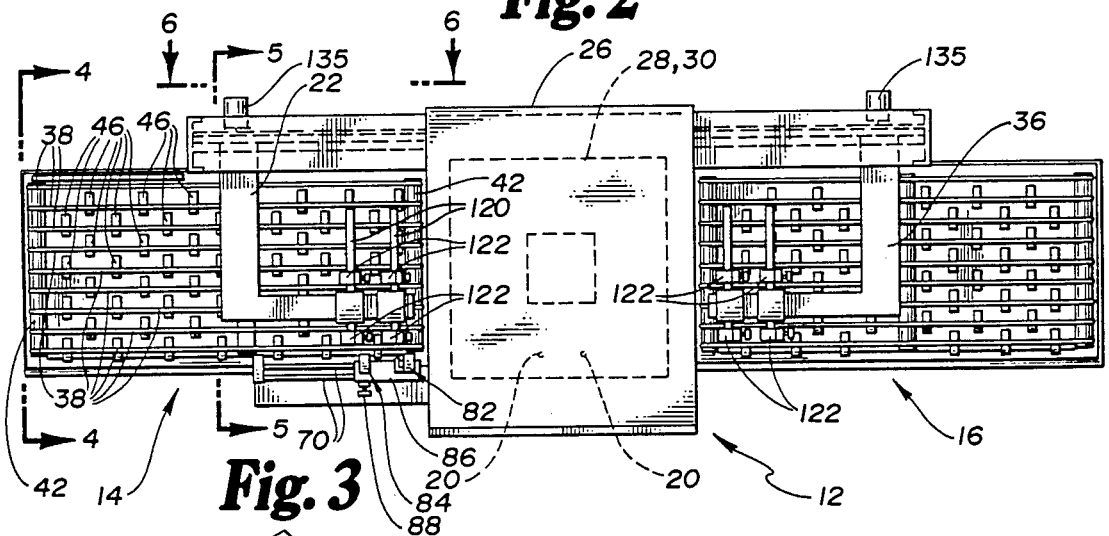
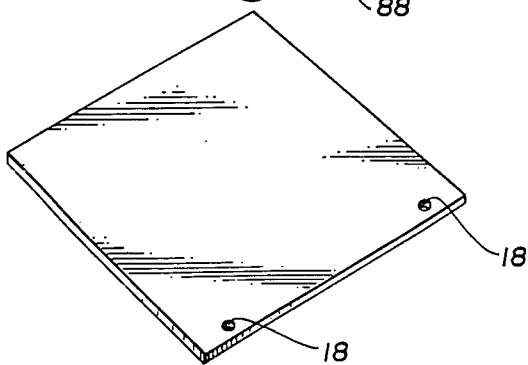

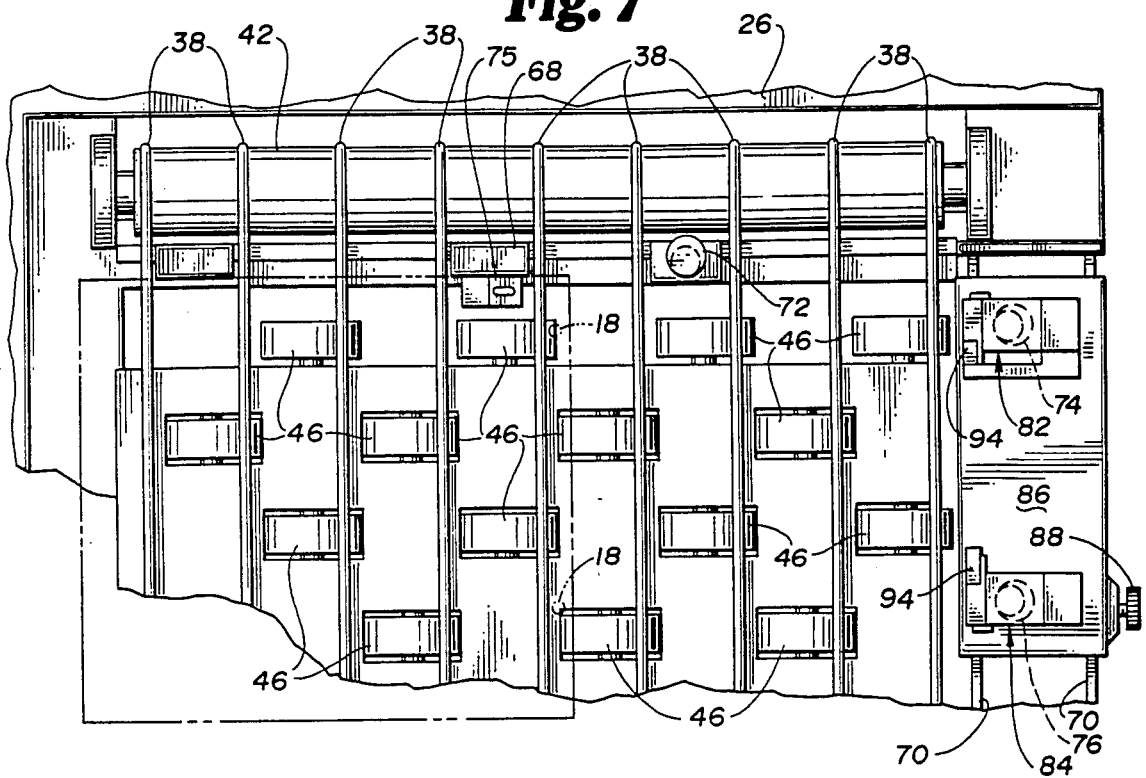
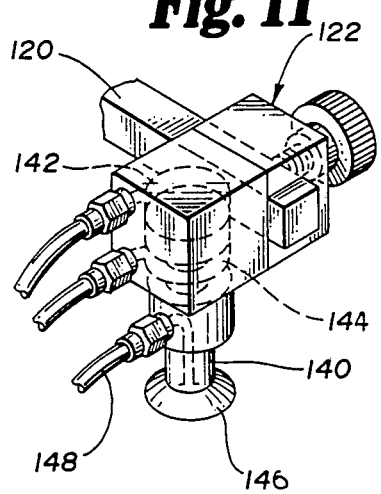

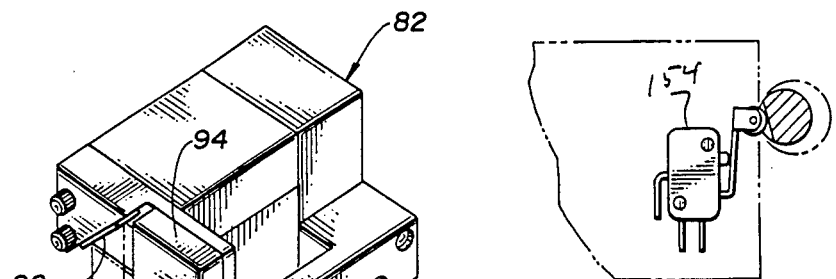
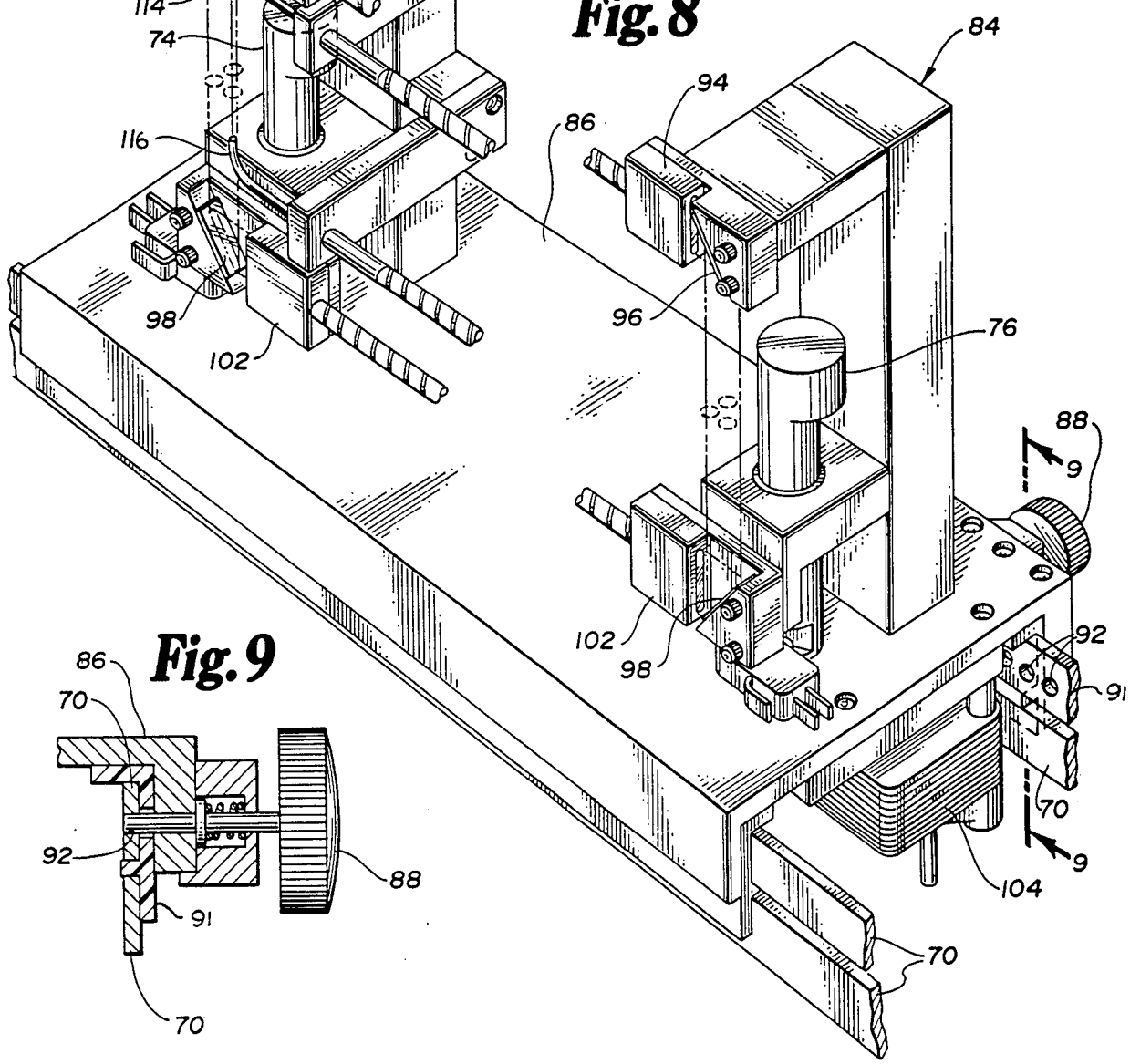
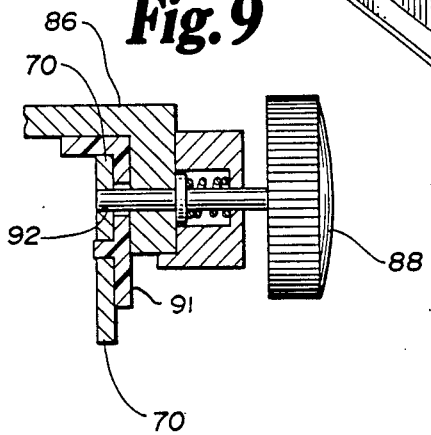

AUTOMATIC PRINTED CIRCUIT BOARD IMAGING SYSTEM

BACKGROUND OF THE INVENTION

This invention relates to a system for photographically forming the pattern of an art work mask on a printed circuit board and more particularly to an improved system for registering a circuit board so it can be loaded, exposed and delivered automatically and without operator intervention.

As will be appreciated by those skilled in the art, a printed circuit board and a mask are brought into precise alignment in an enclosed exposure unit in the process of forming an image of the mask on the board. Typically, pins on a frame in the enclosure fit into apertures on the board to align the board. As will also be appreciated by those skilled in the art, it is difficult to transport and align a board in the exposure area automatically and without operator intervention.

SUMMARY OF THE INVENTION

One object of the invention is the provision of an imaging system in which printed circuit boards can be loaded, registered, and exposed and delivered automatically and without operator intervention.

Another object of this invention is to provide such a system which can be easily and rapidly changed to handle boards of varying sizes.

Briefly, this invention contemplates first automatically aligning apertures on the board outside the exposure unit with reference points established by light beams that have a known spatial relation to the reference points in the enclosure. A movable arm engages the board once it has been aligned, transports it to the vacuum frame and deposits it on the alignment pins.

BRIEF DESCRIPTION OF THE DRAWINGS

FIG. 1 is a front elevational view of one embodiment of an automatic printed circuit board imaging system constructed in accordance with the teachings of this invention;

FIG. 2 is a top plan view of the automatic imaging system shown in FIG. 1;

FIG. 3 is a perspective view of a typical "blank" printed circuit board;

FIG. 7 is a partial top plan view taken along the line 7—7 of FIG. 1;

FIG. 8 is a perspective view with parts broken away, showing details of an alignment carriage;

FIG. 9 is a detailed sectional elevation taken along the line 9—9 of FIG. 8;

FIG. 10 is a detailed top plan view taken at A in FIG. 8; and

FIG. 11 is an enlarged pictorial detailed view of a suction cup assembly.

DETAILED DESCRIPTION OF THE PREFERRED EMBODIMENTS

Figure 4:
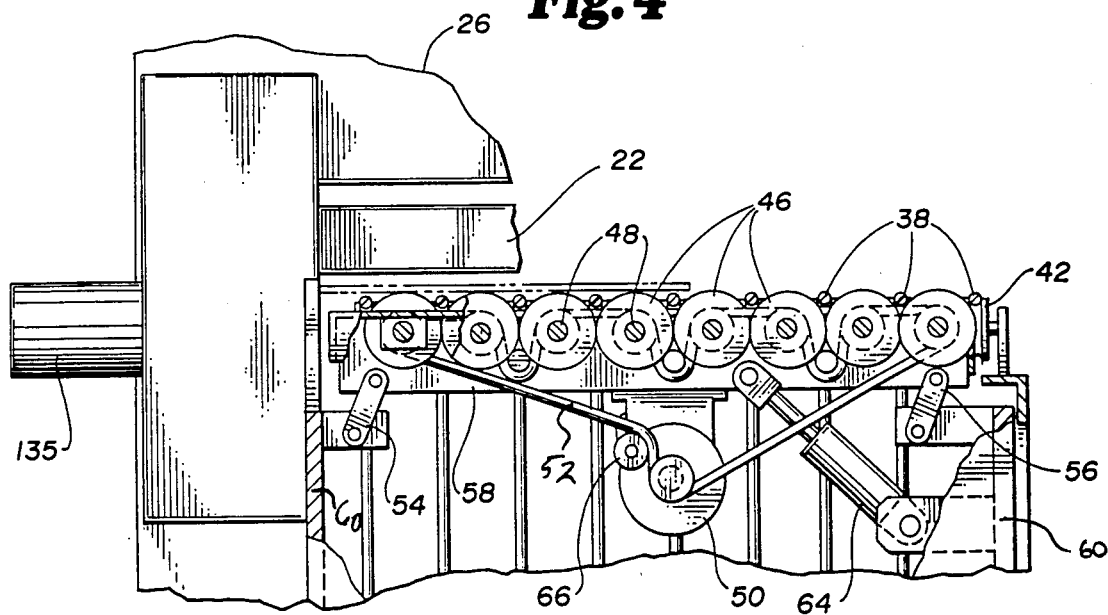
FIG. 4 is a partial right-side sectional elevation taken along the line 4—4 of FIG. 2.

Referring now to FIGS. 1 and 2 of the drawings, major functional components of an automatic imaging system constructed in accordance with the teachings of this invention include a centrally-disposed photographic exposure and imaging unit 12, a printed circuit board transport and aligning unit 14 and a board removal and transport unit 16. Printed circuit boards, such as shown in FIG. 3, are placed initially on the aligning unit 14. Here the registration holes or apertures 18 in the board are precisely prealigned with respect to reference points which have a known relationship in orientation and distance from reference and aligning pins in the exposure unit 12. After prealignment, an L-shaped board handler 22 engages the board, lifts it and moves it into the central imaging unit 12 and deposits it on the alignment pins.

The central imaging unit 12 may comprise suitable commercially available imager. Typically, the imaging unit includes a vacuum frame with a pair of spring-loaded retractable pins 20 that fit into board apertures 18.

The vacuum frame is located in enclosure 26. The top and bottom of the enclosure separate to allow a board to be inserted into and removed from the frame. The top and bottom come together during the imaging process. The enclosure houses a pair of photographic lamps 28 and 30, permitting images to be formed on both sides of the board.

After exposure, a second L-shaped board handler 36 moves into the exposure unit after it opens, lifts the board from the pins and carries it out to the transport unit 16.

Figure 5:
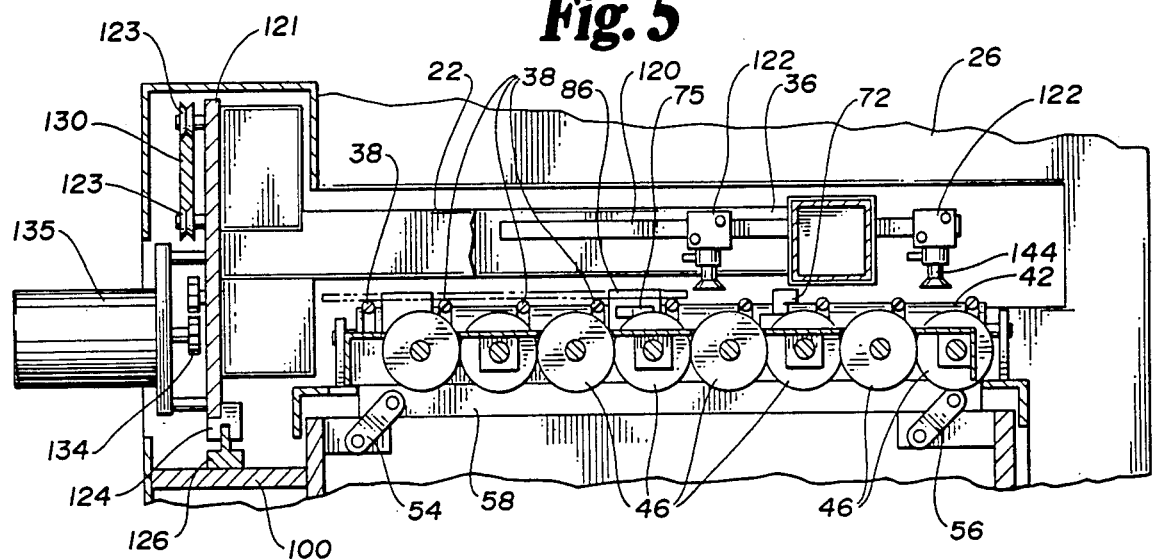
FIG. 5 is a partial right-side sectional elevation taken along the line 5—5 of FIG. 2.

Referring now to FIGS. 4 and 5, as well as FIGS. 1 and 2, the board aligning unit 14 has a number of parallel belts 38 upon which a board can rest and movement of the belts transports and board toward or away from the central exposure unit 12 a so-called x-axis direction. The belts 38 frictionally engage a drum 42 which is driven by a motor 44.

Parallel rows of rollers 46 are located between the belts. Each row of rollers is secured respectively to a shaft 48 and a drive chain 52 frictionally engaging the shafts 48 and the drive shaft of a motor 50.

The shafts 48 are mounted on carriage 58 and pivotal links 54 and 56 movably secure the carriage to a frame 60. A pneumatically operated arm 64 raises and lowers the carriage 52 to correspondingly raise and lower the rollers above and below the belts. An idler 66 maintains tension in the drive belt 52 throughout the range of motion. In the rollers' raised position, the printed circuit board rests upon the portion of the circumference of the rollers projecting above the belts and can be translated by the rollers in a so-called y-axis direction, that is, parallel to the central exposure unit. When the rollers are in their lowered position, a printed circuit board rests upon the belts and is translated by them in a so-called x-axis direction, that is, toward or away from the central exposure unit.

Referring now to FIG. 7, initially the belts 38 drive a printed circuit board (shown in phantom) against an x-axis stop 68 and x-axis cam 72. A photoelectric sensor 75 senses engagement of the board against the stop and cam. A suitable programmable controller (not shown) responds to the sensor signal and energizes the pneumatic arm 64. The rollers 46 rise above the belts, lift the board off of the belts and drive the board against a pair of y-axis cams 74 and 76. A photosensor detects board engagement with the y-axis cams with one edge engaging the y-axis cams 74 and 76 and the other edge engaging the x-axis cam 72 and the stop 68.

As will be appreciated by those skilled in the art, the size of the registration holes in the board and the positional tolerance between the registrational holes is held very close. However, the registration hole to board edge tolerance is not as close, and the board angularity cannot be assumed with any degree of accuracy. Thus, it is necessary to manipulate or dither the position of the board in order to bring the registration holes into coincidence with references on the alignment unit 14.

Referring now to FIG. 8, two sensor towers 82 and 84 are secured to carriage 86 movable with respect to a frame 70. The carriage 86 can be moved with respect to the x-axis cam 72 and stop 68 to accommodate boards of different sizes. A spring-loaded pin 88, shown in detail in FIG. 9, engages one of a number of holes 92 in a slide 91 to lock the carriage in place.

Each of the towers carries a broad-beam fiber optic light emitter 94, a pair of 45-degree mirrors 96 and 98 and a broad-beam fiber optic receiver 102. The broad-beam emitter serve as references to position the printed circuit board alignment holes with respect to the y-axis. The y-axis cams 74 and 76 operate independently, each driven by its own cam drive motor, only one of which, cam drive motor 104, is shown. As the rollers urge the board against the y-axis cam, rotation of a y-axis cam moves or dithers and board along the y-axis until light from the broad band transmitter passes through the aperture to the broad band receiver. When light passes from the transmitter through the aperture to one of the receivers, a signal from the receiver to the programmable control causes the associated cam motor to be deenergized and rotation of the associated cam stops.

After both apertures are aligned along the y-axis, they are then aligned with respect to the x-axis. To this end, the programmable controller energizes the x-axis cam motor, and the x-axis cam 72 moves the board along the x-axis until the board aperture adjacent tower 104 is aligned between a fiber optic point beam emitter 114 and a fiber optic point beam receiver 116. When light passes from the point beam emitter through the aperture to the receiver, alignment is completed and the programmable controller stops x-axis cam 72.

It will be appreciated that the reference established by the broad-beam transmitters and receivers and the point transmitter and receiver have a known precise relation in orientation and distances to the alignment pins in the exposure and imaging unit 12. Preferably, the reference points and the pins are aligned along the x-axis so that after prealignment, the board can be lifted, moved along the x-axis into the exposure unit and deposited on the vacuum frame pins.

Figure 6:
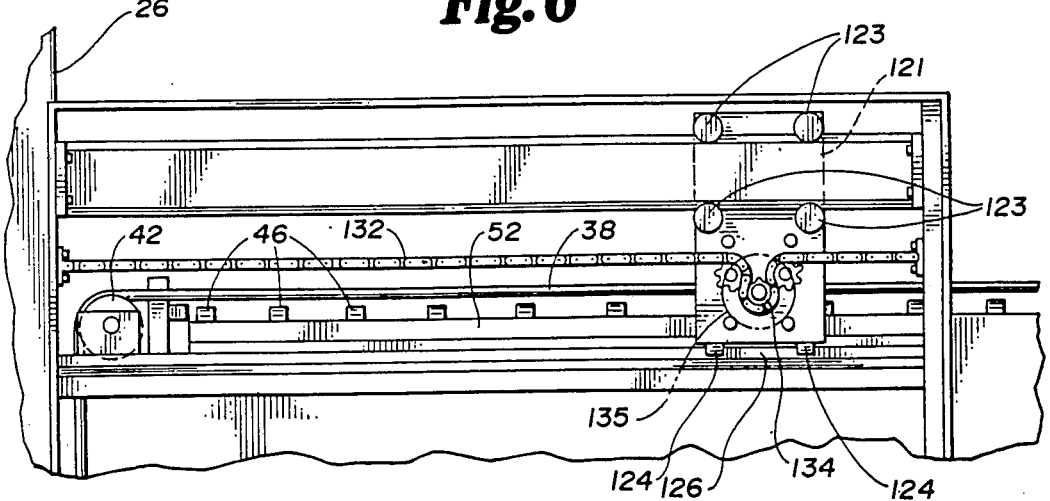
FIG. 6 is a partial elevation taken along the line 6—6 of FIG. 2.

An L-shaped board handler 22 has arms 120 which extend out over the alignment area and carry a pair of pneumatically-movable suction cup units 122. As best seen in FIG. 5, the arm 22 is secured to a support plate 121. A U-shaped guide 124 on the bottom of the plate engages and rides on rib 126 secured to the frame. A pair of wheels 123 on the top of the support plate 121 engage a guide track 130. This upper and lower guide-support system permits x-axis motion only of the board handler. A stationary chain 132, shown best in FIG. 6, engages a sprocket 134 driven by a motor 135 secured to the support plate. When the motor is energized, the sprocket drives the L-shaped arm along the x-axis.

Referring to FIG. 11, each of the suction cup units 122 comprises a centrally-located piston rod 140 and an upper and lower chamber 142 and 144, respectively. Pneumatic pressure applied to the upper chamber through a suitable hose and fitting drives a pair of suction cups 146 downward and, similarly, pneumatic pressure applied to the lower chamber drives them up. Suction can be applied to suction cups 146 through a hose and fitting 148.

In operation, upon receipt of a command from the programmable controller, a loader unit (not shown) indexes a board onto the alignment unit. The programmable controller causes the rollers to lift and move the board until a sensor (not shown) indicates a board is present. The rollers are then lowered and the belts move the board against the x-axis stop and x-axis registration cam. The sensor indicates that the board is present. The rollers again are lifted and drive the board to the y-axis registration cams. These y-axis registration cams rotate independently and align the board along the y-axis. Next, the x-axis cam rotates until one aperture in the board is aligned with the fiber optic point source and receiver. The board is now prealigned. It should be noted that, if alignment cannot be accomplished after two attempts, a preregistration failure may be indicated. As shown most clearly in FIG. 10, the number of attempts can be easily monitored by means of a limit switch 154 and a flat region on the cam drive shaft which operates the limit switch during each revolution.

After the board has been prealigned, a vacuum is applied to the suction cups and they are lowered onto the board. The vacuum cups then raise the board and the motor 135 drives the L-shaped arm into the exposure unit. The controller energizes the vacuum pads to lower the board onto the registration pins in the vacuum frame and hold it in place. Upon receipt of a signal from a suitable sensor that a board is present, the vacuum is released from the suction cups, the suction cup units 122 raise and motor 135 drives the L-shaped arm from the exposure unit. The exposure frame lowers, vacuum is applied to the vacuum frame and the board is exposed. Upon completion of exposure, the vacuum is released on the frame and, after a predetermined delay, the upper frame raises to receive the unload board handler 36.

If the board does not fit smoothly onto the registration pins, the pins, which are spring loaded, will retract and make an electrical contact causing an alarm. A failure to fit smoothly onto the registration pins may occur if the holes are undersize or a change in alignment in the transporting from registration to the vacuum frame occurs.

It will be appreciated that the construction and operation of the unload mechanism are substantially the same as that described for the load mechanism, and no further description beyond that provided by the drawing is therefore needed.

Although the present invention has been described with reference to preferred embodiments, workers skilled in the art will recognize that changes may be made in form and detail without departing from the spirit and scope of the invention.

What is claimed is:

1. An apparatus for automatically loading a printed circuit board on a fixture in an exposure unit so that a reference on the board is aligned with a reference on the fixture, comprising in combination:
   a radiant energy source for establishing a reference outside the exposure unit at a predetermined location relative to said fixture reference;
   means for automatically moving a board relative to said reference establishing means;

means for detecting alignment of a reference on said board and said radiant energy source; and means for moving a board aligned with said reference establishing means to said fixture and depositing said board on said fixture with said board reference aligned with said fixture reference.

2. An apparatus for automatically loading a printed circuit board on a fixture in an exposure unit so that a pair of reference apertures on the board are aligned with a pair of reference pins on said fixture, comprising in combination:

a plurality of light beams for establishing a pair of reference points outside said exposure unit at a predetermined location relative to said pins;

means for automatically moving said board relative to said plurality of light beams in order to align said apertures with said light beams;

means for detecting alignment of said apertures with said light beams; and means for lifting a board aligned with said light beams, moving said board to said fixture, and depositing said board on said fixture with said apertures on said board aligned with said pins.

3. An apparatus for automatically loading a printed circuit board on a fixture in an exposure unit so that reference apertures on the board are aligned with reference pins on the fixture, comprising in combination:

a plurality of light beams for establishing a pair of reference points outside said exposure unit at a predetermined location relative to said pins;

a first cam for engaging one edge of a printed circuit board positioned in the path of said light beams so that rotation of said cam moves said board to bring an aperture on said board into alignment with at least one of said plurality of beams;

a second cam for engaging another edge of said printed circuit board positioned in the path of said plurality of light beams so that rotation of said second cam moves said board to bring an aperture on said board into alignment with at least one of said light beams;

means to detect alignment of said apertures with said light beams; and means for lifting a board aligned with said light beams, moving said board to said fixture, and depositing said board on said fixture with said apertures aligned with said pins.

4. An apparatus for automatically loading a printed circuit board on a fixture as in claim 3 further including:

means for automatically moving a printed circuit board against said firist and said second cams.

5. An apparatus for automatically loading a printed circuit board on a fixture as in claim 3 further including:

a plurality of belts for moving a printed circuit board resting thereon against said first cam; and a plurality of rollers movable between a first position below said belts and a second position above said belts for moving a printed circuit board resting on said rollers against said second cam.

6. An apparatus for automatically loading a printed circuit board on a fixture as in claim 3 wherein said plurality of light beams include a pair of fiber optic emitters emitting a broad light beam for aligning said apertures in said board with respect to one axis, and a fiber optic point beam emitter for aligning said apertures with respect to another axis.

7. An apparatus for automatically loading a printed circuit board on a fixture as in claim 4 wherein said plurality of light beams include a pair of fiber optic emitters emitting a broad light beam for aligning said apertures in said board with respect to one axis, and a fiber optic point beam emitter for aligning said apertures with respect to another axis.

8. An apparatus for automatically loading a printed circuit board on a fixture as in claim 5 wherein said plurality of light beams include a pair of fiber optic emitters emitting a broad light beam for aligning said apertures in said board with respect to one axis, and a fiber optic point beam emitter for aligning said apertures with respect to another axis.

9. An apparatus for automatically loading a printed circuit board on a fixture as in claim 3 wherein said plurality of light beams and said means for detecting alignment are mounted on a carriage movable with respect to said first cam.

10. An apparatus for automatically loading a printed circuit board on a fixture as in claim 4 wherein said plurality of light beams and said means for detecting alignment are mounted on a carriage movable with respect to said first cam.

11. An apparatus for automatically loading a printed circuit board on a fixture as in claim 5 wherein said plurality of light beams and said means for detecting alignment are mounted on a carriage movable with respect to said first cam.

12. An apparatus for automatically loading a printed circuit board on a fixture as in claim 6 wherein said plurality of light beams and said means for detecting alignment are mounted on a carriage movable with respect to said first cam.

13. An apparatus for automatically loading a printed circuit board on a fixture as in claim 7 wherein said plurality of light beams and said means for detecting alignment are mounted on a carriage movable with respect to said first cam.

14. An apparatus for automatically loading a printed circuit board on a fixture as in claim 8 wherein said plurality of light beams and said means for detecting alignment are mounted on a carriage movable with respect to said first cam.

15. An apparatus for automatically loading a printed circuit board on a fixture as in claim 4 wherein said means for lifting, moving and depositing include a pair of movable suction cups mounted on an L-shaped arm.

16. An apparatus for automatically loading a printed circuit board on a fixture as in claim 5 wherein said means for lifting, moving and depositing include a pair of movable suction cups mounted on an L-shaped arm.

17. An apparatus for automatically loading a printed circuit board on a fixture as in claim 6 wherein said means for lifting, moving and depositing include a pair of movable suction cups mounted on an L-shaped arm.

18. An apparatus for automatically loading a printed circuit board on a fixture as in claim 15 further including a second L-shaped arm carrying a paid of movable suction cups for removing said board from said fixture.

19. An apparatus for automatically loading a printed circuit board on a fixture as in claim 17 further including a second L-shaped arm carrying a pair of movable suction cups for moving said board from said fixture.

* * * * *